United States Patent [19]

Motegi et al.

[11] Patent Number: 4,912,433

[45] Date of Patent: Mar. 27, 1990

[54] VCO CONTROLLED BY SEPARATE PHASE LOCKED LOOP

[75] Inventors: Hiroyuki Motegi, Kawasaki; Hiroki Muroga; Satoshi Suzuki, both of Yokohama, all of Japan

[73] Assignee: Kabushiki Kaisha Toshiba, Kawasaki, Japan

[21] Appl. No.: 352,540

[22] Filed: May 16, 1989

[30] Foreign Application Priority Data

May 17, 1988 [JP] Japan .................. 63-119701

[51] Int. Cl.$^4$ .................. H03L 7/08; H03L 7/16
[52] U.S. Cl. .................. 331/8; 331/17; 331/27; 331/34; 331/57; 358/191.1; 358/194.1; 358/195.1; 455/260
[58] Field of Search .................. 331/1 R, 2, 8, 17, 25, 331/27, 57, 34; 358/191.1, 194.1, 195.1; 455/260

[56] References Cited

U.S. PATENT DOCUMENTS

| | | | |
|---|---|---|---|
| 3,614,649 | 10/1971 | Gerig .................. | 331/17 |
| 4,091,335 | 5/1978 | Giolma et al. .................. | 331/8 |
| 4,131,861 | 12/1978 | Malaviya .................. | 331/2 |
| 4,336,505 | 6/1982 | Meyer .................. | 331/1 R |
| 4,623,851 | 11/1986 | Abou .................. | 331/111 |
| 4,623,852 | 11/1986 | Abou et al. .................. | 331/111 |
| 4,829,545 | 5/1989 | Guzik et al. .................. | 331/1 A |
| 4,859,970 | 8/1989 | Matsuo et al. .................. | 331/57 |

OTHER PUBLICATIONS

IEEE Journal of Solid-State Circuits, vol. SC-22, No. 2, Apr. 1987, pp. 255-261, entitled: Design of PLL-Based Clock Generation Circuits.

Primary Examiner—Siegfried H. Grimm
Attorney, Agent, or Firm—Finnegan, Henderson, Farabow, Garrett and Dunner

[57] ABSTRACT

A voltage controlled oscillator (VCO) is controlled by a separate phase locked loop (PLL). The PLL includes a first variable delay circuit of m stages which receives a reference frequency signal and produces a delayed signal which is compared in a phase comparator with the reference frequency signal. A first control signal generating circuit in the PLL receives the output of the phase comparator and a reference voltage to produce a first control signal for controlling the delay of the first variable delay circuit. The VCO contains a ring oscillator formed of a second variable delay circuit of n stages similar to those of the first variable delay circuit. A second control signal generating circuit in the VCO receives the output of the phase comparator and a control voltage to produce a second control signal for controlling the delay of the second variable delay circuit to thereby control the output frequency of the VCO.

25 Claims, 9 Drawing Sheets

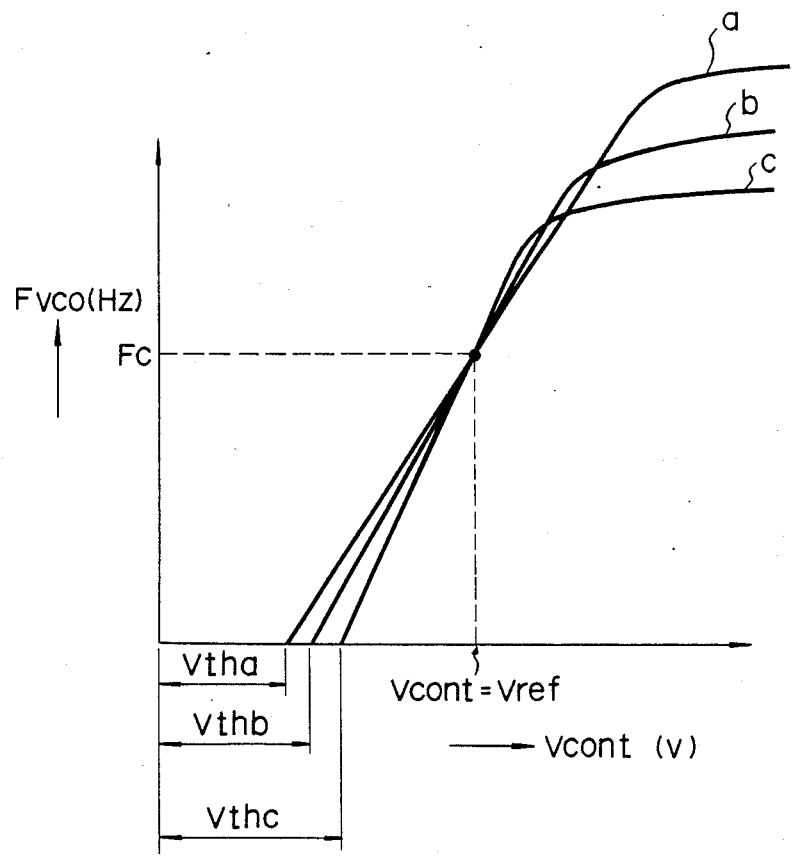
F I G. 9

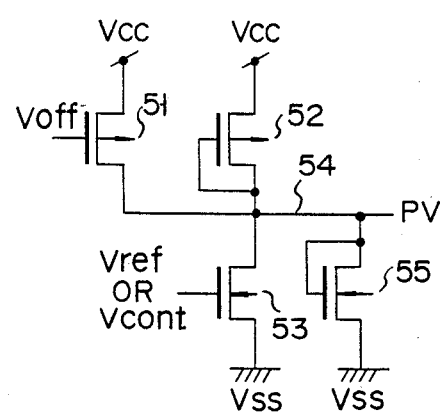
F I G. 12
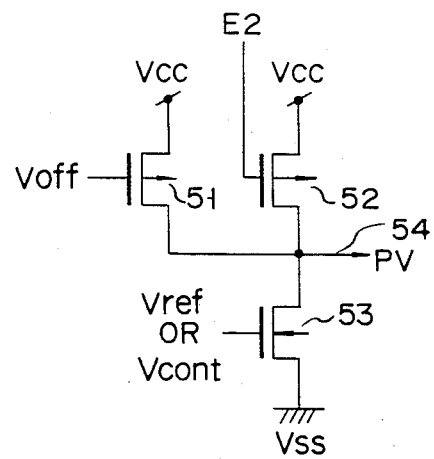
F I G. 13
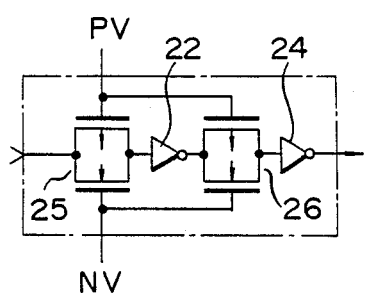
F I G. 14
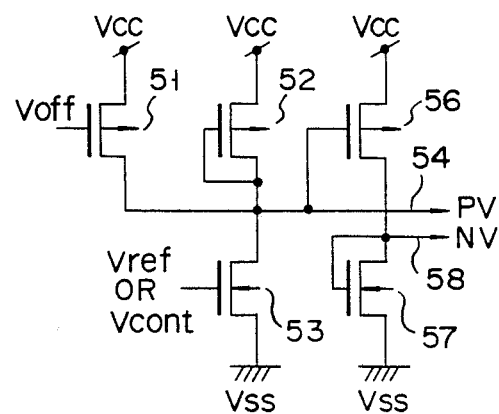
F I G. 15

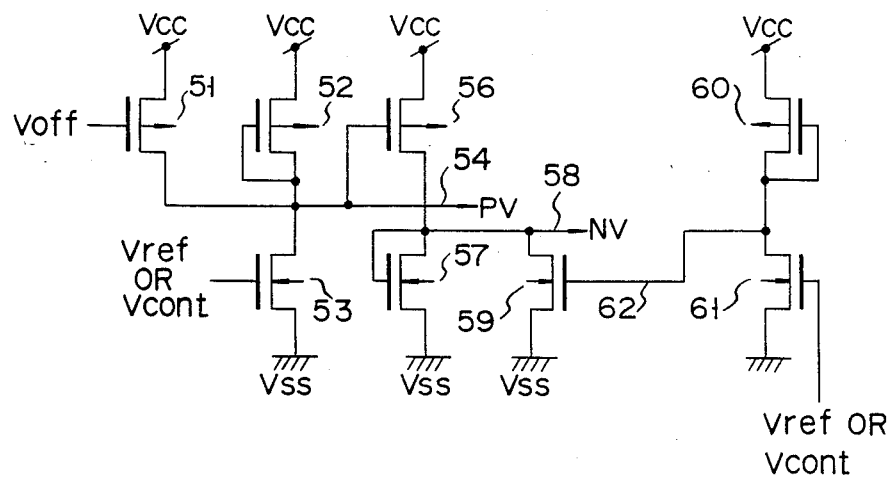
F I G. 16

4,912,433

VCO CONTROLLED BY SEPARATE PHASE LOCKED LOOP

BACKGROUND OF THE INVENTION

1. Field of the Invention

This invention relates to a voltage controlled oscillator circuit formed in an integrated circuit configuration for use in a frequency synthesizer of phase-locked loop form.

2. Description of the Related Art

Conventionally, a voltage controlled oscillator (VCO) whose output frequency varies in response to a control voltage is constructed as shown in FIG. 17. (FIG. 17 corresponds to FIG. 3 of Japanese Patent Disclosure No. 59-62215)

In FIG. 17, 71 denotes an input node for control voltage Vin, 72 an input N-channel transistor, and 73 and 74 load P-channel transistors constituting current mirror circuit 75. P-channel transistor 76 and N-channel transistor 77 ar combined to constitute first CMOS inverter 78, and first capacitor 80 is connected between output node 79 of inverter 78 and the ground terminal. Further, P-channel transistor 81 and N-channel transistor 82 are combined to constitute second CMOS inverter 83, and second capacitor 85 is connected between output node 84 of inverter 83 and the ground terminal.

Output nodes 79 and 84 of CMOS inverters 78 and 83 are respectively connected to input terminals of voltage comparators 86 and 87 whose output terminals are connected to set input terminal S and reset input terminal R of RS flip-flop circuit 88. Set output terminal Q and reset output terminal $\overline{Q}$ of flip-flop circuit 88 are respectively connected to first and second CMOS inverters 78 and 83, and the output from reset output terminal $\overline{Q}$ is inverted by means of inverter 89 and derived out as output voltage Vout.

The operation of the above VCO is briefly explained. Current is supplied to input transistor 72 in response to control voltage Vin, and at this time, current I of the same amount is supplied from output transistor 74 of current mirror circuit 75 to two CMOS inverters 78 and 83. Assume that, in the initial condition, output terminal Q of flip-flop circuit 88 is set at low level "L" and output terminal $\overline{Q}$ is set at high level "H". Then, transistors 76 and 82 of the two CMOS inverters 78 and 83 are turned on and transistors 77 and 81 are turned off. In this condition, first capacitor 80 is charged by current I via transistor 76 which is now set in the conductive state.

When, in this charging operation, the terminal voltage of capacitor 80 exceeds threshold voltage Vth1 of voltage comparator 86, the output thereof becomes high. Then, outputs Q and $\overline{Q}$ of flip-flop circuit 88 are inverted to high and low levels, respectively, thereby setting transistors 76 and 82 of the two CMOS inverters 78 and 83 nonconductive and transistors 77 and 81 conductive. As a result, second capacitor 85 is charged via transistor 81 by current I. At this time, charges of previously charged capacitor 80 are discharged to the ground terminal via transistor 77 which is no set conductive.

When the terminal voltage of second capacitor 85 which is now being charged exceeds threshold voltage Vth2 of comparator 87, the output thereof becomes high. As a result, outputs Q and $\overline{Q}$ of flip-flop circuit 88 are inverted to low and high, respectively, thereby setting transistors 76 and 82 conductive and setting transistors 77 and 81 nonconductive as described before. By repeatedly effecting the same operation, oscillator output voltage Vout can be derived from the output terminal of inverter 89, and frequency f of the oscillator output voltage is obtained as follows:

$$f = \frac{I}{2C \cdot V\text{ref}} \quad (1)$$

where C is a capacitance of capacitors 80 and 85, and Vref is threshold voltage Vth1 or Vth2 of voltage comparator 86 or 87.

When the conventional VCO is formed on an IC chip, the gate length, gate threshold voltage and gate oxide film thickness of the transistors will fluctuate depending on variation in the manufacturing conditions (process parameters). Therefore, I, C and Vref in equation (1) may significantly vary, causing the oscillation center frequency to widely fluctuate. Thus, the characteristics of a phase-locked loop (PLL) system using the VCO may be degraded, lowering the manufacturing yield.

This invention has been made to solve the problem that the oscillation center frequency is widely changed with variation in the manufacturing condition and the manufacturing yield of applied system products is lowered.

SUMMARY OF THE INVENTION

An object of this invention is to provide a voltage controlled oscillator circuit whose oscillation center frequency can be freely set without receiving any influence due to variation in the manufacturing condition.

A voltage controlled oscillator circuit of this invention comprises a phase-locked loop section which includes first delay mean having cascade-connected m-stage delay sections whose delay times are controlled by a control signal, for delaying a reference frequency signal; phase difference voltage generating means for generating a phase difference voltage corresponding to a phase difference between a signal delayed by a predetermined period (e.g., one half the period thereof) and the reference frequency signal; and first control signal generating means for generating the control signal for determining the signal delay times of the respective delay sections of the first delay means based on a reference voltage and the phase difference voltage; and a voltage controlled oscillator section which includes second delay means including cascade-connected n-stage delay sections having the structure equivalent to that of the delay sections of the first delay means, wherein the output of the second delay means is fed back to the input terminal thereof so that a ring oscillator is constructed; and second control signal generating means for generating a control signal for determining the signal delay times of the respective delay sections of the second delay means based on a control voltage for controlling the output frequency and the phase difference voltage.

Each of the delay sections of the first and second delay means includes a first transmission gate; an inverter supplied with the output of the first transmission gate; a second transmission gate supplied with the output of the inverter; and an inverter supplied with the output of the second transmission gate. Each of the first and second control signal generating means includes a first transistor of a first conductivity type whose source-drain path is connected between a first voltage terminal and a first output node and whose gate is supplied with the phase difference voltage; second transistor of the first conductivity type whose source-drain path is connected between the first voltage terminal and the first output node and whose gate is connected to the first output node; and a third transistor of a second conductivity type whose source-drain path is connected between a second voltage terminal and the first output node and whose gate is supplied with either the reference voltage or the control voltage. Signals of the first output nodes of the first and second control signal generating means are supplied to the first and second transmission gates of each of the delay sections of the first and second delay means.

The center frequency of the oscillator frequency can be determined by controlling the delay time of the second delay means constituting the ring oscillator in the voltage controlled oscillator circuit. Since the delay time can be precisely controlled by means of the phase-locked loop section, a stable center frequency which is independent of variation in the manufacturing condition can be obtained. Further, the band width of the center frequency can be freely set by changing the reference frequency signal or the ratio of the number (m) of delay sections of the first delay means to that (n) of delay sections of the second delay means.

BRIEF DESCRIPTION OF THE DRAWINGS

FIG. 9 is a characteristic diagram of the level conversion circuit of FIG. 5;

FIGS. 12 and 13 are circuit diagrams each showing still another detail construction of a level conversion circuit shown in FIG. 1;

FIG. 14 is a circuit diagram showing another detail construction of a one-stage section of the variable delay circuit show in FIG. 1;

FIGS. 15 and 16 are circuit diagrams showing the level conversion circuit of FIG. 1 in a case where the variable delay circuit of FIG. 14 is used;

DETAILED DESCRIPTION OF THE PREFERRED EMBODIMENTS

There will now be described an embodiment of this invention with reference to the accompanying drawings.

Figure 1:
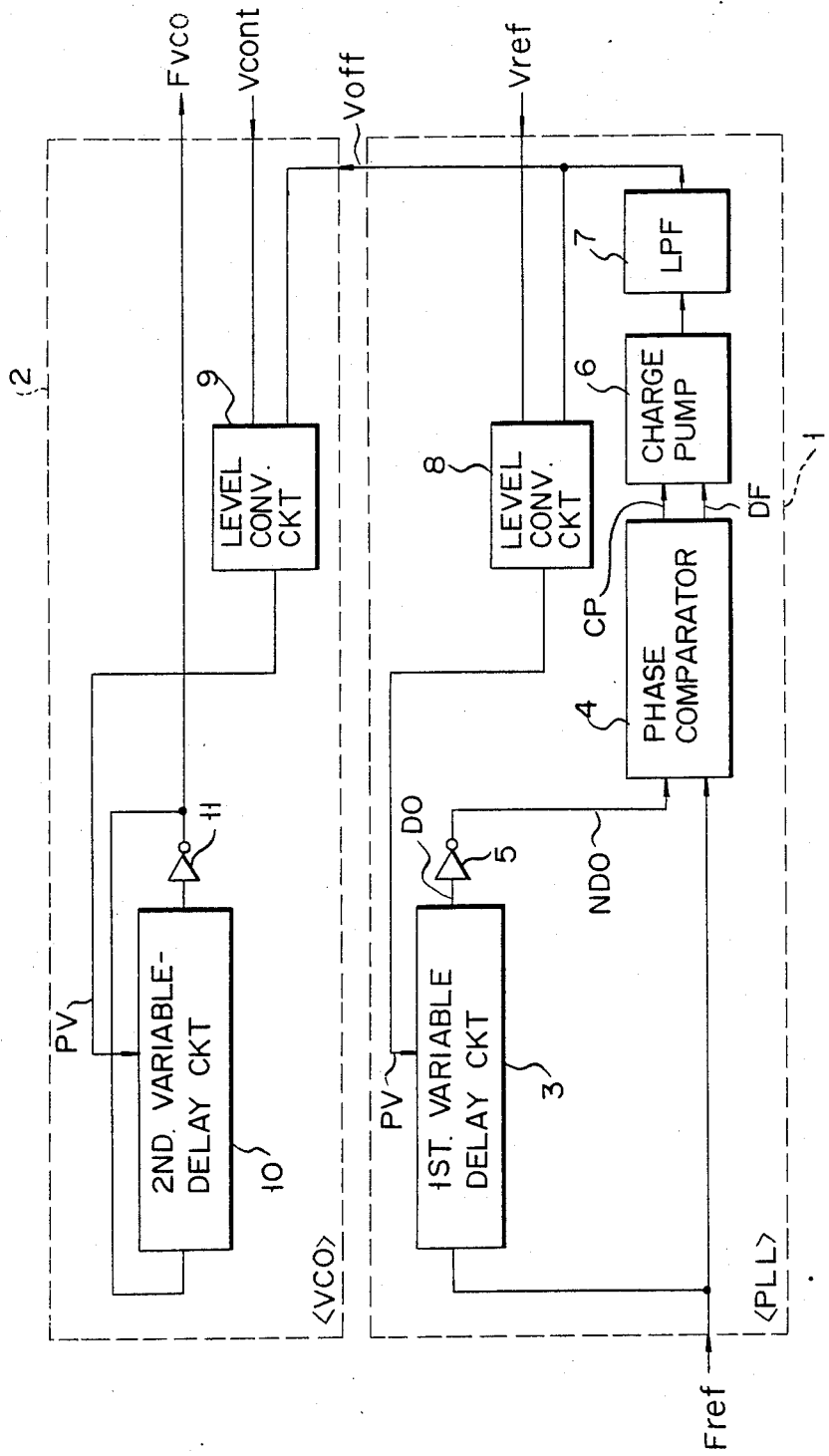
FIG. 1 is a block diagram showing the whole construction of a voltage controlled oscillator circuit according to one embodiment of this invention.

FIG. 1 is a block diagram showing the whole construction of a voltage controlled oscillator circuit according to one embodiment of this invention. In FIG. 1, 1 denotes a PLL section, and 2 denotes a VCO section. PLL section 1 is supplied with reference frequency signal Fref and reference voltage Vref and controls the feedback operation so as to set the delay time of delay circuit 3 in the loop to constant value, for example, one half period T of reference frequency signal Fref.

VCO section 2 is supplied with control voltage Vcont and output voltage Voff of low-pass filter 7 of the phase-locked loop of PLL section 1, and oscillation frequency $F_{VCO}$ is determined by controlling the delay time of the ring oscillator circuit using delay circuit 10 based on the received control voltage (Vcont) and output voltage (Voff).

In PLL section 1, reference frequency signal Fref is supplied to the first input terminals of first variable delay circuit 3 and phase comparator 4. Output DO of first variable delay circuit 3 is input to the other input terminal of phase comparator 4 via inverter 5. Phase comparator 4 compares the phases of the two input signals and controls first output CP or second output DP according t the comparison result.

The two outputs CP and DP are supplied to charge pump circuit 6. The output of charge pump circuit 6 is supplied to low-pas filter (LPF) 7 whose output voltage Voff is supplied together with reference voltage Vref to first level conversion circuit 8. First level conversion circuit 8 controls the voltage level of output PV according to the two input voltage levels, and output voltage PV is supplied as a delay time control signal to variable delay circuit 3.

In VCO section 2, output voltage Voff of low-pas filter 7 and control voltage Vcont are supplied to second level conversion circuit 9. Like first level conversion circuit 8, second level conversion circuit 9 controls the voltage level of output PV according to the two input voltage levels. Output voltage PV is supplied as a delay time control signal to second variable delay circuit 10.

Inverter 11 is connected between the input and output terminals of second variable delay circuit 10 to constitute a ring oscillator circuit. Second level conversion circuit 9, second variable delay circuit 10 and inverter 11 are formed with substantially the same constructions as first level conversion circuit 8, first variable delay circuit 3 and inverter 5.

Figure 2:
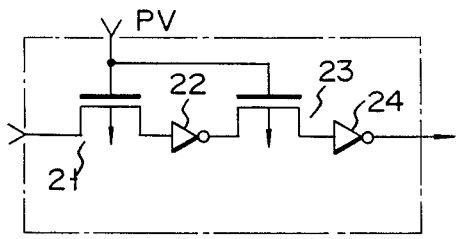
FIG. 2 is a circuit diagram showing the detail construction of a one-stage section of a variable delay circuit shown in FIG. 1.

For example, each of variable delay circuits 3 and 10 is constituted by cascade-connecting a desired number of basic circuits each having the structure shown in FIG. 2. Variable delay circuit 3 is formed of m-stage cascade-connected basic circuits and variable delay circuit 10 is formed of n-stage cascade-connected basic circuits in this example.

An input signal is serially supplied via first transfer gate 21 of a P-channel transistor, inverter 22, second transfer gate 23 of a P-channel transistor and inverter 24, and then output. The gates of first and second transfer gates 21 and 23 are supplied with delay time control signal PV. That is, the resistance components of first and second transfer gates 21 and 23 are changed according to delay time control signal PV to change the delay time of each basic circuit.

Figure 3:
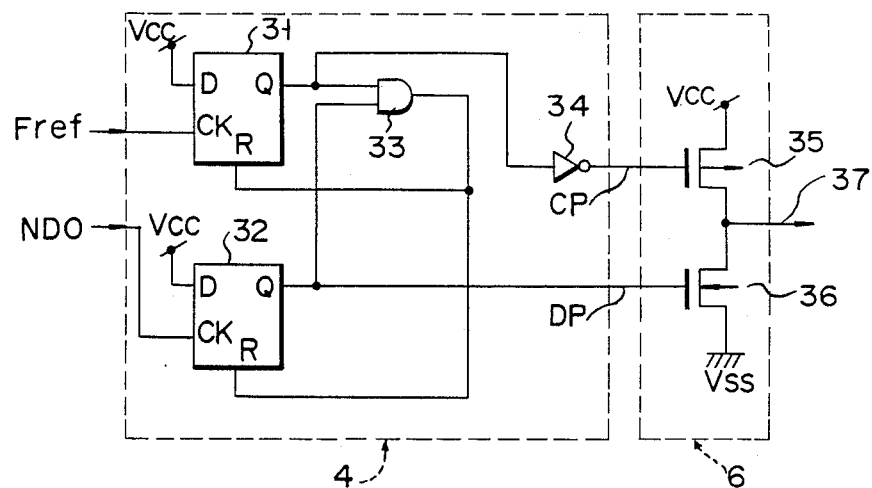
FIG. 3 is a circuit diagram showing the detail construction of a phase comparator and a charge pump circuit shown in FIG. 1.

FIG. 3 is a circuit diagram showing the detail construction of phase comparator 4 and charge pump circuit 6. In phase comparator 4, reference frequency signal Fref is supplied as a clock signal to D-type flip-flop 31. Likewise, output NDO of inverter 5 in FIG. 1 is supplied as a clock signal to D-type flip-flop 2. Q outputs of flip-flops 31 and 32 are supplied to AND gate 33 whose output is in turn supplied as a reset signal to flip-flops 31 and 32.

Output Q of flip-flop 31 is supplied as first output CP via inverter 34, and output Q of flip-flop 32 is supplied as output DP.

Charge pump circuit 6 includes P-channel transistor 35 and N-channel transistor 36 series-connected between power source voltage terminal Vcc and the ground terminal. The gates of transistors 35 and 36 are respectively supplied with first output CP and second output DP of phase comparator 4.

Figures 4A, 4B:
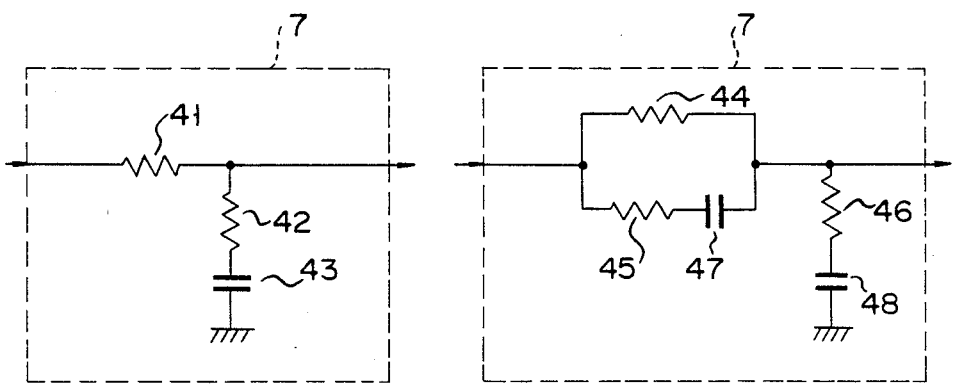
FIGS. 4A and 4B are circuit diagrams showing the detail construction of a low-pass filter shown in FIG. 1.

As shown in FIG. 4A, for example, low-pass filter includes resistors 41 and 42 and capacitor 43. It is also possible to constitute low-pass filter 7 by resistors 44, 45, and 46 and capacitors 47 and 48 as shown in FIG. 4B.

Figure 5:
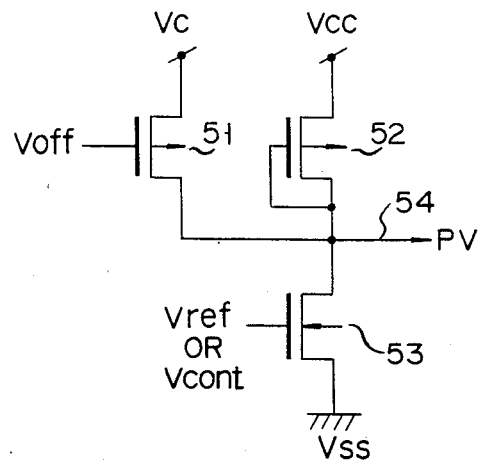
FIG. 5 is a circuit diagram showing the detail construction of a level conversion circuit shown in FIG. 1.

As shown in FIG. 5, for example, each of first and second level conversion circuits 8 and 9 is constituted by two P-channel transistors 51 and 52 and one N-channel transistor 53.

The source-drain path of P-channel transistor 51 is connected between power source voltage terminal Vcc and node 54 from which voltage PV is derived, and the gate of transistor 51 is supplied with output voltage Voff of low-pass filter 7.

The source-drain path of P-channel transistor 52 is connected between power source voltage terminal Vcc and node 54, and the gate of transistor 52 is connected to node 54. The source-drain path of N-channel transistor 53 is connected between node 54 and the ground terminal.

In the case of first level conversion circuit 8, the gate of transistor 53 is supplied with reference voltage Vref, and in the case of second level conversion circuit 9, the gate of transistor 53 is supplied with control voltage Vcont.

There will now be described the operation of PLL circuit section 1 of FIG. 1.

Figure 6:
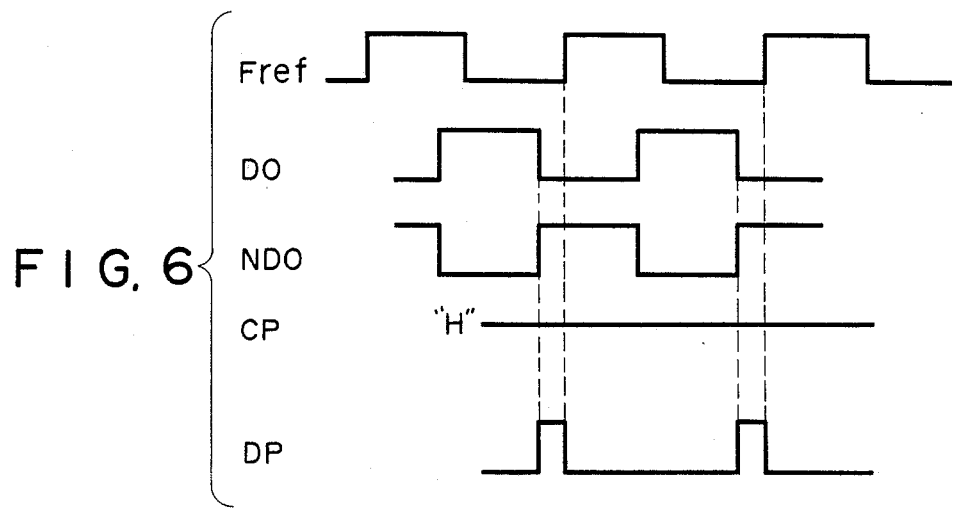
FIGS. 6 to 8 are timing charts showing the operation of a PLL section shown in FIG. 1.

As shown in the timing chart of FIG. 6, first output CP of phase comparator 4 is set at a high level ("H") when the delay time of variable delay circuit 3 including the delay time of inverter 5 is shorter than T/2 (T is a period of reference frequency signal Fref). At this time, second output DP of phase comparator 4 is kept at a high level in a period by which the delay time is shorter than T/2. The high level portion of second output DP is supplied as a discharging pulse to charge pump circuit 6.

In charge pump circuit 6, N-channel transistor 36 of FIG. 3 is set conductive in the high level period of output DP, thereby discharging output 37. As a result, output voltage Voff of low-pass filter 7 s lowered. In this case, if reference voltage Vref is kept constant at a voltage equal to half power source voltage Vcc, output voltage PV of level conversion circuit 8 will rise.

Assume now that output voltage Voff of low-pass filter 7 is supplied to the gate of P-channel transistor 51 and reference voltage Vref is supplied to the gate of N-channel transistor 53. Then, a current flowing into P-channel transistor 51 increases when voltage Voff is lowered as described above, and thus voltage PV of node 54 rises. As a result, the resistance components of transfer gates 21 and 23 of each of the basic circuits in first variable delay circuit 3 of FIG. 2 increase, thereby increasing the delay time of variable delay circuit 3.

Figure 7:
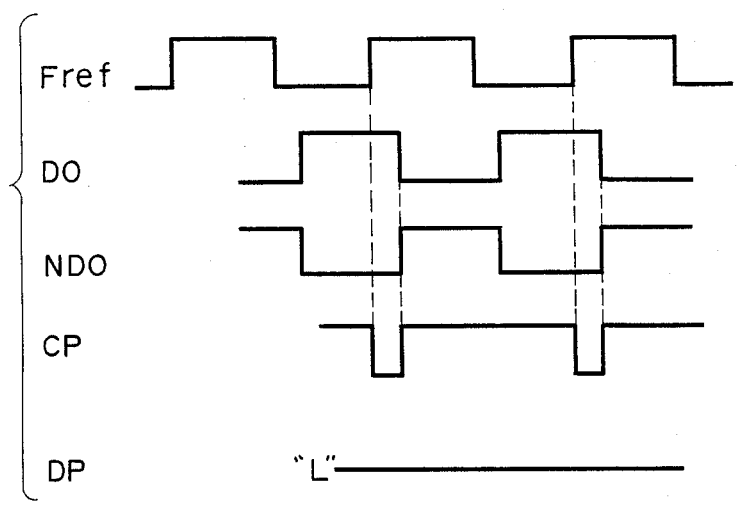

In contrast with the above case, when the delay time of variable delay circuit 3 including the delay time of inverter 5 is longer than T/2 (T is a period of reference frequency signal Fref) as shown in the timing chart of FIG. 7, second output DP of phase comparator 4 is set at a low level ("L"). At this time, first output CP of phase comparator 4 is kept at a low level in a period by which the delay time is longer than T/2. The low level portion of first output CP is supplied as a charging pulse to charge pump circuit 6. In charge pump circuit 6, P-channel transistor 35 of FIG. 3 is set conductive in the low level period of output CP, thereby charging output 37. As a result, output voltage Voff of low-pass filter 7 is raised. Thus, in this case, voltage PV of node 54 is lowered. As a result, the resistance components of transfer gates 21 and 23 of each of the basic circuits in first variable delay circuit 3 of FIG. 2 decrease, thereby reducing the delay time of variable delay circuit 3.

Figure 8:
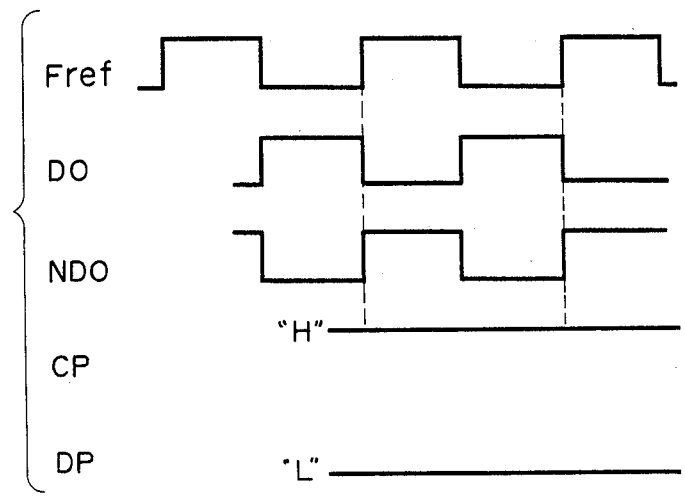

When the delay time of first variable delay circuit 3 is set equal to T/2 as shown in the timing chart of FIG. 8 and the PLL loop is set into the stable condition, outputs CP and DP of phase comparator 4 are respectively set at constant levels of "H" and "L". At this time, output PV of first level conversion circuit 8 is set at a constant potential level and the delay time of first variable delay circuit 3 is kept constant.

By performing the above operation, the delay time of variable delay circuit 3 can be precisely controlled.

In VCO section 2, if control voltage Vcont is set at the same level as reference voltage Vref, the same inputs as those supplied to first level conversion circuit 8 of PLL section 1 are supplied to second level conversion circuit 9. As a result, the delay time of each basic circuit in second variable delay circuit 10 becomes equal to that of each basic circuit in first variable delay circuit 3 of PLL section 1.

In this case, delay time t for each stage of the basic circuit in first variable delay circuit 3 can be expressed as follows:

$$t = \frac{1}{Fref} \times \frac{1}{2} \times \frac{1}{m} \tag{2}$$

Further, oscillation frequency $F_{VCO}$ of the ring oscillator circuit formed of second variable delay circuit 10 and inverter 11 of VCO section 2 can be expressed as follows:

$$F_{VCO} = \frac{1}{t} \times \frac{1}{n} \times \frac{1}{2} = \frac{1}{2nt} \tag{3}$$

The following equation can be obtained by substituting equation (3) into equation (2).

$$F_{VCO} = \left(\frac{m}{n}\right) Fref \tag{4}$$

In this way, oscillation frequency $F_{VCO}$ of the ring oscillator circuit of VCO section 2 can be determined only by a ratio of the values of n and m and reference frequency signal Fref. Therefore, the oscillation output with the stable center frequency can be obtained without receiving influence of variation in the manufacturing condition. Further, output PV of level conversion circuit 9 can be controlled by adequately changing the level of control voltage Vcont. Therefore, the delay time of variable circuit 10 can be changed so as to control oscillation frequency $F_{VCO}$.

FIG. 9 shows an example of the characteristic of oscillation frequency signal $F_{VCO}$ (Hz) with respect to control voltage Vcont (V). In FIG. 9, values Vtha, Vthb and Vthc of control voltage Vcont at which characteristic curves a, b, and c start to rise are threshold voltages of N-channel transistor 53 in the level conversion circuit of FIG. 5. That is, variation in the threshold voltage of transistor 53 affects oscillation frequency signal $F_{VCO}$ as fluctuation in the manufacturing condition, and in general, the variation range is approx. 0.6 V.

The above characteristic can be obtained as follows. First, output voltage Voff of low-pass filter 7 is applied to the gate of P-channel transistor 51 and control voltage Vcont is applied to the gate of N-channel transistor 53 of FIG. 5 in second level conversion circuit 9 of VCO section 2. In this case, transistor 53 is kept nonconductive before control voltage Vcont exceeds the threshold voltage of transistor 53.

At this time, assume that transistor 51 supplied with voltage Voff is set in the conductive state. Then, transistor 52 is turned on if the potential difference between the gate and source thereof is larger than the threshold voltage of the P-channel transistor. However, voltage PV of output node 54 is set at the Vcc level by means of transistor 51 which is set in the conductive state. Therefore, the transfer gates (21, 23 in FIG. 2) in each basic circuit of variable second delay circuit 10 are turned off by output voltage PV. As a result, the ring oscillator circuit including second variable delay circuit 10 and inverter 11 will not oscillate. Therefore, as shown in FIG. 9, oscillation frequency signal $F_{VCO}$ becomes 0 (Hz). When control voltage Vcont has exceeded the threshold voltage of transistor 53, characteristic curves a, b, and c start to rise. Each of characteristic curves a, b, and c passes center frequency Fc at which Vcont = Vref.

As described above, with the level conversion circuit having the construction of FIG. 5, a characteristic curve of oscillator frequency signal $F_{VCO}$ can be obtained which is first kept at a frequency of 0 Hz, starts to increase when Vcont has exceeded the threshold voltage of transistor 53, and then passes preset center frequency Fc.

Assume now that Vcc is 5 (V), Vref is 2.5 (V), and threshold voltage Vth of N-channel transistor 53 is 1.2 (V), and $F_{VCO}$ is set to 10 (MHz) when Vcont = Vref = 2.5 (V). Then, it is possible to realize a VCO circuit which has a variable frequency range of 0 to 10 (MHz) with respect to the range of Vcont from 0 to 2.5 (V).

In a case where the level conversion circuit of FIG. 5 is used as level conversion circuits 8 and 9 in FIG. 1, the $F_{VCO}$ characteristic curve starts to abruptly rise when Vcont shown by the characteristic diagram of FIG. 9 has exceeded the threshold voltage of transistor 53. That is, the inclination of each of characteristic curves a, b, and c becomes steeper and $\Delta F_{VCO}/\Delta Vcont$ becomes relatively large. As a result, noise introduced from the exterior into the VCO circuit of FIG. 1 may cause $\Delta F_{VCO}$ to significantly vary for a small amount of variation in $\Delta Vcont$, so that the oscillation frequency may fluctuate. Further, the variable range of Vcont is narrowed by threshold voltage VthN of the N-channel transistor with respect to the ground voltage.

Figure 10:
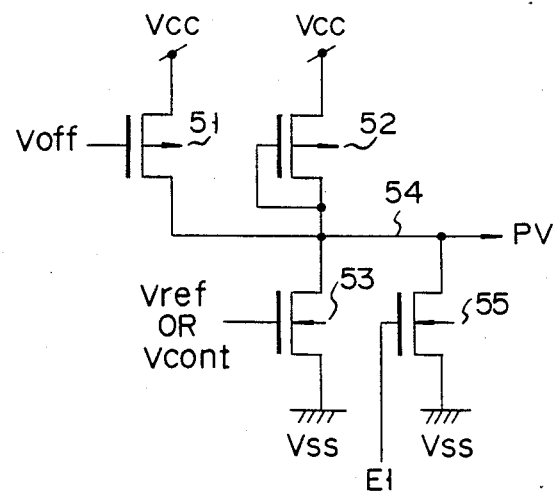
FIG. 10 is a circuit diagram showing another detail construction of a level conversion circuit shown in FIG. 1.

In such a case, a circuit shown in FIG. 10 may be used as first and second level conversion circuits 8 and 9 to solve the above problem. That is, the level conversion circuit of FIG. 10 further includes N-channel transistor 55 whose source-drain path is connected between node 54 and the ground terminal and whose gate is supplied with constant voltage E1. In this case, constant voltage E1 is set higher than the threshold voltage of N-channel transistor 55, and transistor 55 is normally kept in the conductive state.

Figure 11:
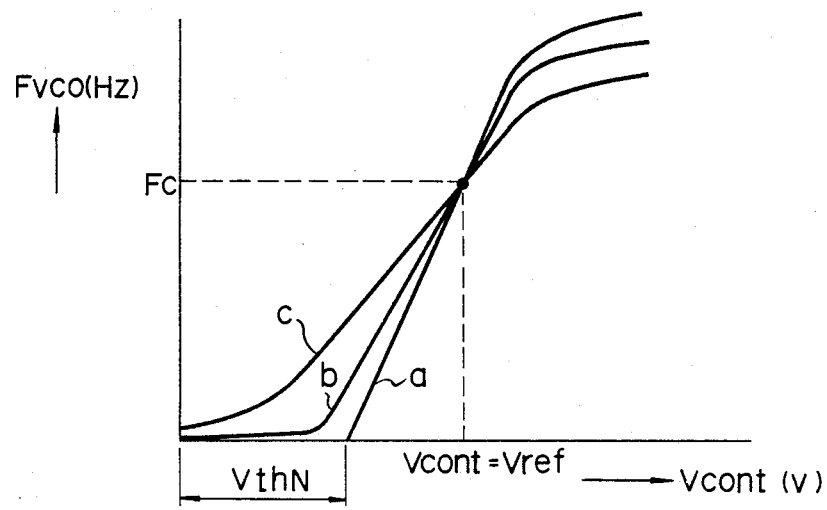
FIG. 11 is a characteristic diagram of the level conversion circuit of FIG. 10.
Figure 17:
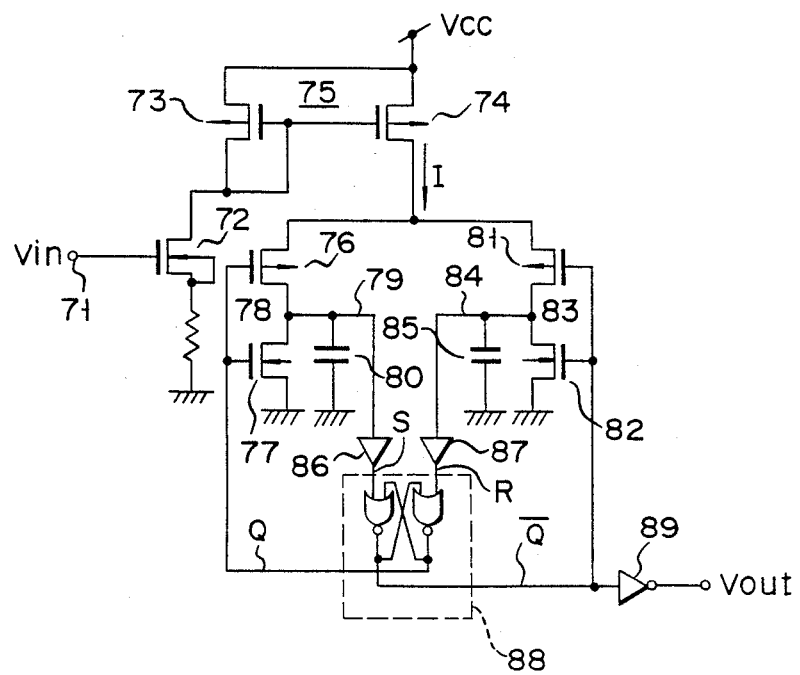
FIG. 17 is a circuit diagram showing a conventional voltage controlled oscillator circuit.

Since, in the level conversion circuit, transistor 55 is normally kept in the conductive state, voltage PV tends to change from Vcc towards the ground voltage, and is set to a stable voltage level determined by transistors 51, 52, 53 and 55. Therefore, the characteristic of oscillation frequency signal $F_{VCO}$ (Hz) with respect to control voltage Vcont (V) becomes gentle as shown by characteristic curves a, b, and c in FIG. 11 when the size of transistor 55 is increased. Further, the variable range of Vcont can b widened to the ground voltage.

FIG. 12 is a circuit diagram showing the detail construction of the first and second level conversion circuits used in the VCO circuit in the above embodiment. In the case of the circuit of FIG. 12, the gate of N-channel transistor 55 in the circuit of FIG. 10 is not connected to receive constant voltage E1 but is connected to the drain thereof or output node 54 for voltage PV. When the gate of transistor 55 is supplied with substantially constant voltage E1 as shown in FIG. 10, a current flowing into transistor 55 becomes constant and transistor 55 functions as a constant current source. In contrast, when the gate of transistor 55 is connected to the drain thereof as shown in FIG. 12, transistor 55 is normally kept in the conductive state and substantially the same characteristic as in the case of FIG. 11 can be obtained.

FIG. 13 is a circuit diagram showing the detail construction of first and second level conversion circuits 8 and 9 used in the VCO circuit of the above embodiment. In the case of the circuit of FIG. 13, the gate of P-channel transistor 52 in the circuit of FIG. 5 is not connected to output node 54 for voltage PV but is connected to receive constant voltage E2. With this connection, transistor 52 is used as a constant current load. Also, in this example, the same characteristic as shown in FIG. 9 can be obtained.

FIG. 14 is a circuit diagram showing another construction of the basic circuit used in each of variable delay circuits 3 and 10. In the basic circuit of FIG. 14, an input signal is serially supplied via first CMOS transfer gate 25 formed of P-channel and N-channel transistors, inverter 22, second CMOS transfer gate 26 formed of P-channel and N-channel transistors, and inverter 24 and is then output. The gates of the P-channel transistors of first and second CMOS transfer gates 25 and 26 are supplied with delay time control signal PV, and the gates of the N-channel transistors are supplied with another delay time control signal NV.

The voltage level of delay time control signal NV is set to be higher or lower according as the voltage level of delay time control signal PV becomes lower or higher, respectively.

FIG. 15 is a circuit diagram showing the detail construction of first and second level conversion circuits 8 and 9 in the case where variable delay circuits 3 and 10 are constituted by the basic circuits shown in FIG. 14.

The circuit of FIG. 15 is constituted by additionally providing P-channel transistor 56 and N-channel transistor 57 in the circuit of FIG. 5. The source-drain path of P-channel transistor 56 is connected between power source voltage Vcc and output node 58 for delay time control signal NV, and the gate thereof is connected to output node 54 for signal PV. Likewise, the source-drain path of N-channel transistor 57 is connected between output node 58 for signal NV and the ground terminal, and the gate thereof is connected to output node 58 for signal NV. Thus, transistors 56 and 57 are combined to constitute an inverter for inverting signal PV so that output voltage NV thereof will vary in a direction opposite to that of variation in input signal PV.

In the level conversion circuit of FIG. 15, the amount of variation in signal NV with respect to the amount of variation in control voltage Vcont or reference voltage Vref supplied to the gate of transistor 53 tends to decrease. Therefore, a difference will occur between the amounts of variation in signals PV and NV for the same amount of variation in reference voltage Vref or control voltage Vcont. As a result, the amount of variation in the gate voltage of the N-channel transistors of first and second CMOS transfer gates 25 and 26 of the basic circuit shown in FIG. 14 becomes small. Therefore, the amount of variation in the delay time of the basic circuit becomes smaller so that the controllability of the oscillation frequency may be degraded.

If the difference between the amounts of variation in signals PV and NV may cause serious problems, it is preferable to use a level conversion circuit with the construction shown in FIG. 16 instead of the level conversion circuit shown in FIG. 15. In the level conversion circuit of FIG. 16, in order to compensate for the reduction in the amounts of variation in signal NV, N-channel transistor 59, P-channel transistor 10 and N-channel transistor 61 are additionally provided in the circuit of FIG. 15.

The source-drain path of transistor 59 is connected between output node 58 for signal NV and the ground terminal. The source-drain path of transistor 60 is connected between power source voltage terminal Vcc and gate node 62 of transistor 59, and the gate thereof is connected to node 62. Further, the source-drain path of transistor 61 is connected between node 62 and the ground terminal, and the gate thereof is connected to receive reference voltage Vref o control voltage Vcont.

With the above level conversion circuit, when reference voltage Vref or control voltage Vcont rises, PV is lowered and NV is raised. At this time, a voltage of node 62 is lowered by means of an inverter formed of transistors 60 and 61. As a result, a current flowing into transistor 59 decreases. In this way, transistor 59 functions to raise NV so as to compensate for reduction in the mount of variation in NV.

The voltage controlled oscillation circuit according to the above embodiment is constituted by MOS transistors, but it is also possible to a voltage controlled oscillation circuit by use of bipolar transistors.

Figure 18:
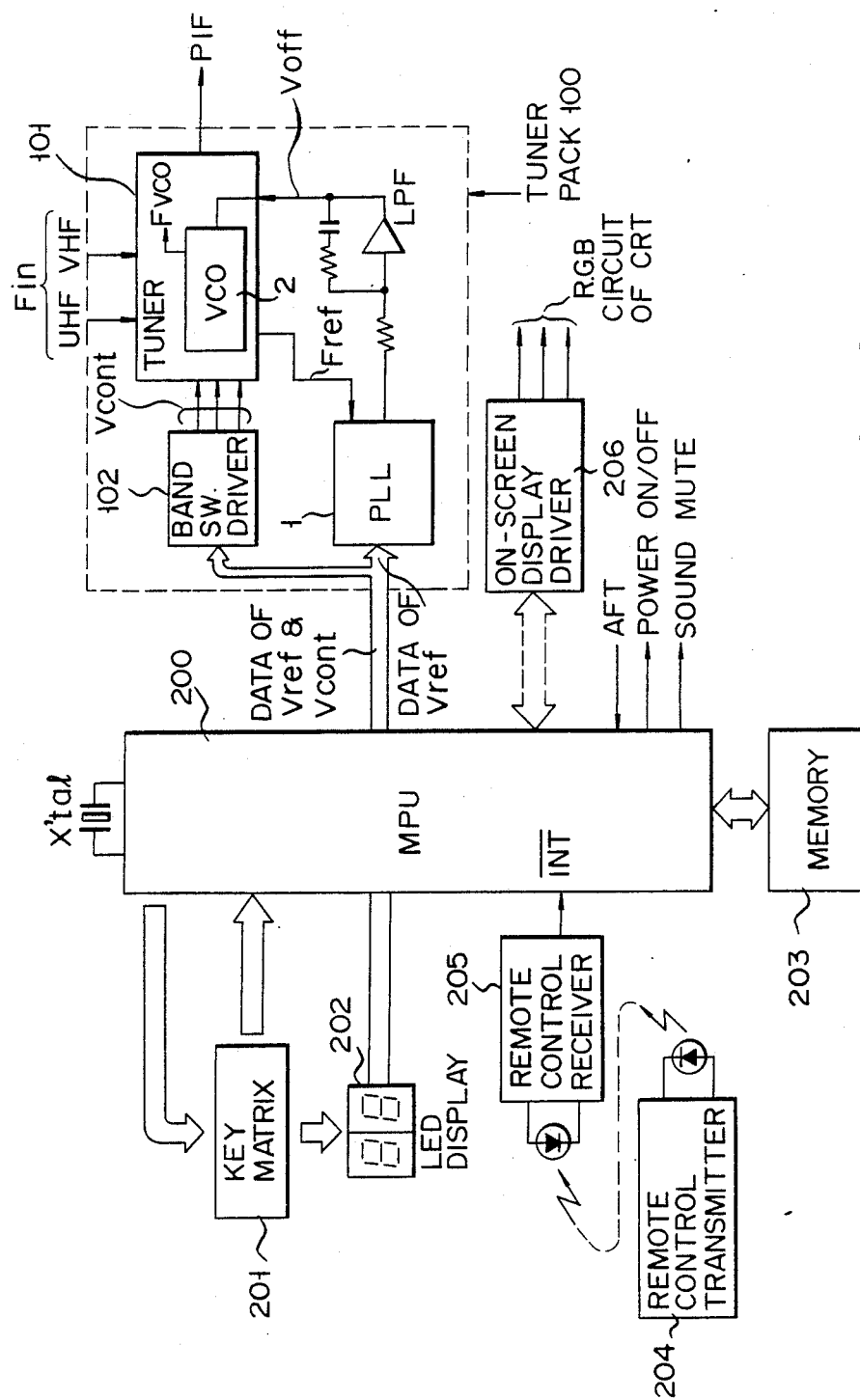
FIG. 18 is a block diagram showing the construction of a PLL frequency synthesizer type tuning system in which PLL section 1 and VCO section 2 shown in FIG. 1 are used for the local oscillation section of a super heterodyne tuner.

FIG. 18 shows a PLL frequency synthesizer type tuning system including a voltage controlled oscillation circuit according to this invention. In the system of FIG. 18, PLL section 1 and VCO section 2 of FIG. 1 are used in the local oscillator of a super heterodyne type tuner. The construction of PLL section 1 and VCO section may be the same as that of FIG. 1.

In FIG. 18, UHF or VHF television input signal Fin is input to super heterodyne tuner 101. In tuner 101, the frequency of input signal Fin is lowered (or divided) by means of a prescaler to obtain a high frequency signal of a desired frequency, if necessary. The high frequency signal is frequency-converted to intermediate frequency signal PIF of a preset frequency, using a beat between the high frequency signal and oscillation output Fvco of VCO section 2.

Control voltage Vcont for determining the oscillation frequency of VCO section 2 can be derived from band switching driver 102 and selectively set according to data Vcont from microcomputer (MPU) 200.

Reference frequency signal Fref supplied from tuner 101 is input to PLL section 1, and output Voff of PLL section 1 is supplied to VCO section 2 via an LPF circuit. (In FIG. 18, since an LPF is separately provided outside PLL section 1, PLL 7 in FIG. 1 can be omitted). Reference voltage Vref supplied to PLL section 1 can be obtained by D/A converting data Vref from MPU 200.

That is, when the user depresses a preset key of key matrix 201 to specify a desired reception channel, LED display 202 displays the reception channel. When the channel specification is input to MPU 200, MPU 200 supplies data Vref and Vcont corresponding to the specified reception channel to PLL section 1 and band switching driver 102, according to the program and data stored in memory 203.

For example, the channel specification may be effected by using a combination of remote control transmitter 204 and remote control receiver 205. The results of various specifications by the remote control are supplied to on-screen display driver 206. Then, the RGB circuit of a CRT (not shown) is driven by means of driver 206, add the result of color adjustment or reception channel specified by the remote control is displayed on the CRT.

Tuner 101, switching driver 102, PLL section 1, LPF and the like are integrally formed as tuner pack 100 and can be manufactured and adjusted independently from the circuit of MPU 200.

As described above, according to this invention, the center frequency of the oscillation frequency can be determined by controlling the delay time of the variable delay circuit. Since the delay time can be precisely controlled by means of the phase-locked loop, a stable center frequency can be obtained without receiving any influence due to fluctuation in the manufacturing condition. Further, since the delay time is changed by the reference frequency signal, the center frequency can be freely set to a desired value and the frequency band of the oscillation frequency can also be freely set.

What is claimed is:

1. A voltage controlled oscillator circuit comprising:
   a PLL section for supplying a deviation signal according to a received reference frequency signal and a received reference voltage; and a VCO section for supplying an oscillation output according to the deviation signal and a received control voltage;
   said PLL section comprising:
   first delay means for delaying the reference frequency signal according to first delay control signal and outputting a delay signal;

phase difference detection means for comparing the phase of the reference frequency signal with that of the delay signal and outputting the deviation signal based on the phase difference; and first delay control means for outputting the first delay control signal having a signal level corresponding to the reference voltage and the deviation signal.

2. A circuit according to claim 1, wherein the delay time caused by said first delay means is selected to be substantially one-half the period of the reference frequency signal.

3. A circuit according to claim 1, wherein said VCO section includes:

second delay control means for outputting a second delay control signal producing a signal level corresponding to the control voltage and the deviation signal; and second delay means for cyclically delaying the oscillation output according to the second delay control signal and generating the oscillation output.

4. A circuit according to claim 1, wherein said first delay means includes:

a plurality of transmission gates; and a plurality of inverters alternately series-connected to said plurality of transmission gates; and the first delay control signal is used as gate inputs of said plurality of transmission gates.

5. A circuit according to claim 3, wherein said second delay means includes:

a plurality of transmission gates; and a plurality of inverters alternately series-connected to said plurality of transmission gates; and the second delay control signal is used as gate inputs of said plurality of transmission gates.

6. A circuit according to claim 1, wherein said first delay means includes:

a plurality of CMOS transmission gates; and a plurality of inverters alternately series-connected to said plurality of CMOS transmission gates; and the first delay control signal is used as gate inputs of one channel type gates of said plurality of CMOS transmission gates and an inverted signal of the first delay control signal is used as gate inputs of the other channel type gates of said plurality of CMOS transmission gates.

7. A circuit according to claim 3, wherein said second delay means includes:

a plurality of CMOS transmission gates; and a plurality of inverters alternately series-connected to said plurality of CMOS transmission gates; and the second delay control signal is used as gate inputs of one channel type gates of said plurality of CMOS transmission gates and an inverted signal of the second delay control signal is used as gate inputs of the other channel type gates of said plurality of CMOS transmission gates.

8. A circuit according claim 1, wherein said phase difference detecting means includes:

a first D-type flip-flop clocked by the reference frequency signal;

a second D-type flip-flop clocked by the delay signal;

means for resetting said first and second D-type flip-flops according to the logical product of Q outputs of said first and second D-type flip-flops;

a first transistor of a first conductivity type driven by an inverted signal of the Q output of said first D-type flip-flop;

a second transistor of a second conductivity type driven by the Q output signal of said second D-type flip-flop; and means for deriving the deviation signal from a signal which is obtained by combining outputs of said first and second transistors.

9. A circuit according to claim 8, wherein said deriving means includes a low-pass filter for filtering the combined signal to output the deviation signal.

10. A circuit according to claim 1, wherein said first delay control means includes:

a first MOS transistor of a first conductivity type having a gate supplied with the deviation signal, a source connected to a first power source circuit and a drain for outputting the first delay control signal;

a second MOS transistor of the first conductivity type having a source connected to said first power source circuit and a drain and a gate connected to the drain of said first MOS transistor; and a third MOS transistor of a second conductivity type having a gate supplied with the reference voltage, a source connected to a second power source circuit and a drain connected to the drain of said first MOS transistor.

11. A circuit according to claim 3, wherein said second delay control means includes:

a first MOS transistor of a first conductivity type having a gate supplied with the deviation signal, a source connected to a first power source circuit and a drain for outputting the first delay control signal;

a second MOS transistor of the first conductivity type having a source connected to said first power source circuit and a drain and a gate connected to the drain of said first MOS transistor; and a third MOS transistor of a second conductivity type having a gate supplied with the control voltage, a source connected to a second power source circuit and a drain connected to the drain of said first MOS transistor.

12. A circuit according to claim 10, wherein said first delay control means further includes:

a fourth MOS transistor of the second conductivity type having a gate supplied with a preset bias voltage, a source connected to said second power source circuit and a drain connected to the drain of said first MOS transistor.

13. A circuit according to claim 11, wherein said second delay control means further includes:

a fourth MOS transistor of the second conductivity type having a gate supplied with a preset bias voltage, a source connected to said second power source circuit and a drain connected to the drain of said first MOS transistor.

14. A circuit according to claim 10, wherein said first delay control means further includes:

a fourth MOS transistor of tee second conductivity type having a source connected to said second power source circuit, and a gate and a drain connected to the drain of said first MOS transistor.

15. A circuit according to claim 11, wherein said second delay control means further includes:

a fourth MOS transistor of the second conductivity type having a source connected to said second power source circuit, and a gate and a drain connected to the drain of said first MOS transistor.

16. A circuit according to claim 1, wherein said first delay control means includes:
- a first MOS transistor of a first conductivity type having a gate supplied with the deviation signal, a source connected to a first power source circuit and a drain for outputting the first delay control signal;
- a second MOS transistor of the first conductivity type having a source connected to said first power source circuit, a gate supplied with a preset bias voltage and a drain connected to the drain of said first MOS transistor; and
- a third MOS transistor of a second conductivity type having a gate supplied with the reference voltage, a source connected to a second power source circuit and a drain connected to the drain of said first MOS transistor.

17. A circuit according to claim 3, wherein said second delay control means includes:
- a first MOS transistor of a first conductivity type having a gate supplied with the deviation signal, a source connected to a first power source circuit and a drain for outputting the first delay control signal;
- a second MOS transistor of the first conductivity type having a source connected to said first power source circuit, a gate supplied with a preset bias voltage and a drain connected to the drain of said first MOS transistor; and
- a third MOS transistor of a second conductivity type having a gate supplied with the control voltage, a source connected to a second power source circuit and a drain connected to the drain of said first MOS transistor.

18. A frequency synthesizer type tuning system comprising:
- a PLL section for outputting a deviation signal according to a preset reference frequency signal and a preset reference voltage;
- a VCO section for outputting an oscillation output having a frequency corresponding to a preset control voltage and the deviation signal;
- a tuner section for generating an intermediate frequency signal of a preset frequency which is obtained by frequency-converting a high frequency input signal, using a beat between the high frequency input signal and the oscillation output; and
- a microcomputer section for supplying data corresponding to the reference voltage and the control voltage to said PLL section and VCO section;

wherein said PLL section comprises:
- first delay means for delaying the reference frequency signal according to a first delay control signal and outputting a delay signal;
- phase difference detection means for comparing the phase of the reference frequency signal with that of the delay signal and outputting the deviation signal based on the detected phase difference; and
- first delay control means for generating the first delay control signal having a signal level corresponding to a preset reference voltage and the deviation signal.

19. A tuning system according to claim 18, wherein said VCO section includes:
- second delay control means for generating a second delay control signal having a signal level corresponding to the control voltage and the deviation signal; and
- second delay means for cyclically delaying the oscillation output according to the second control signal and generating the oscillation output.

20. A voltage controlled oscillator circuit comprising:
- a phase-locked loop section which includes first delay means, having cascade-connected m-stage delay sections whose delay times are controlled by a control signal, for delaying a reference frequency signal by a predetermined period; phase difference voltage generating means for generating a phase difference voltage corresponding to a phase difference between the output of said first delay means and the reference frequency signal; and first control signal generating means for generating the control signal for determining the signal delay times o the respective delay sections of said first delay means based on a reference voltage and the phase difference voltage; and
- a voltage controlled oscillator section which includes second delay means, including cascade-connected n-stage delay sections having structures equivalent to those of the delay sections of said first delay means, wherein an output of said second delay means is fed back to the input terminal thereof so that a ring oscillator circuit is constituted; and second control signal generating means for generating a control signal for determining the signal delay times of the respective delay sections of said second delay means based on the phase difference voltage and a control voltage for controlling the output frequency.

21. A circuit according to claim 20, wherein each of the delay sections of said first and second delay means includes a first transmission gate; an inverter supplied with the output of said first transmission gate; a second transmission gate supplied with the output of said inverter; and an inverter supplied with the output of said second transmission gate.

22. A circuit according to claim 21, wherein each of said first and second control signal generating means includes a first transistor of a first conductivity type whose source-drain path is connected between a first voltage terminal and a first output node and whose gate is supplied with the phase difference voltage; a second transistor of the first conductivity type whose source-drain path is connected between said first voltage terminal and said first output node and whose gate is connected to said first output node; and a third transistor of a second conductivity type whose source-drain path is connected between a second voltage terminal and said first output node and whose gate is supplied with either the reference voltage or the control voltage; signals of the first output nodes of said first and second control signal generating means being supplied to said first and second transmission gates of each of the delay sections o said first and second delay means.

23. A circuit according to claim 20, 21, or 22, wherein each of the delay sections of said first and second delay means includes a first CMOS transmission gate formed of P-channel and N-channel transistors; an inverter supplied with the output of said first CMOS transmission gate; a second CMOS transmission gate formed of P-channel and N-channel transistors supplied with the output of said inverter; and an inverter supplied with the output of said second CMOS transmission gate.

24. A circuit according to claim 23, wherein each of said first and second control signal generating means includes:
- a first transistor of a first conductivity type whose source-drain path is connected between a first voltage terminal and a first output node and whose gate is supplied with the phase difference voltage;
- a second transistor of the first conductivity type whose source-drain path is connected between said first voltage terminal and said first output node and whose gate is connected to said first output node;
- a third transistor of a second conductivity type whose source-drain path is connected between a second voltage terminal and said first output node and whose gate is supplied with either the reference voltage or the control voltage;
- a fourth transistor of the first conductivity type whose source-drain path is connected between said first voltage terminal and a second output node and whose gate is connected to said first output node; and
- a fifth transistor of the second conductivity type whose source-drain path is connected between said second voltage terminal and said second output node and whose gate is connected to said second output node.

25. A circuit according to claim 24, wherein signals of the first output nodes of said first and second control signal generating means are supplied to the P-channel transistors of said first and second CMOS transmission gates of each of the delay sections of said first and second delay means and signals of the second output nodes of said first and second control signal generating means are supplied to the N-channel transistors of said first and second CMOS transmission gates of each of the delay sections of said first and second delay means.

* * * * *